United States Patent [19]

Hall

[11] Patent Number: 5,028,978

[45] Date of Patent: Jul. 2, 1991

[54] COMPLEMENTARY BIPOLAR COMPLEMENTARY CMOS (CBICMOS) TRANSMISSION GATE

[76] Inventor: John H. Hall, 3169 Payne, Apt. #50, San Jose, Calif. 95117

[21] Appl. No.: 589,057

[22] Filed: Sep. 27, 1990

[51] Int. Cl.⁵ .................. H01L 27/02; H01L 29/48; H01L 29/72
[52] U.S. Cl. .................. 357/43; 357/15; 357/20; 357/34; 357/41; 357/42; 357/44; 307/570; 307/571; 307/575; 307/576; 307/577
[58] Field of Search .................. 357/43, 42, 15, 41, 357/20, 34, 44; 307/570, 571, 575, 576, 577

[56] References Cited

U.S. PATENT DOCUMENTS

| | | | |
|---|---|---|---|
| 4,794,441 | 12/1988 | Sugawara et al. | 357/43 |
| 4,920,399 | 4/1990 | Hall | 357/42 |
| 4,967,246 | 10/1990 | Tanaka | 357/43 |

FOREIGN PATENT DOCUMENTS

| | | | |
|---|---|---|---|
| 59-86923 | 5/1984 | Japan | 357/43 |
| 61-93655 | 5/1986 | Japan | 357/43 |
| 63-244767 | 10/1988 | Japan | 357/43 |

*Primary Examiner*—Andrew J. James
*Assistant Examiner*—Ngan V. Ngo
*Attorney, Agent, or Firm*—Henry K. Woodward

[57] ABSTRACT

A CBiCMOS transmission gate in which the sources of a CMOS transistor pair are connected to an input and the drains are connected to the bases of a complementary bipolar transistor pair. The bipolar transistor pair is serially connected between a plus voltage potential and ground whereby a logic one applied to the input is transmitted through the PMOS transistor to the base of an NPN transistor which applies the plus voltage to an output terminal, and a logic zero applied to the input is transmitted to the NMOS transistor to the base of a PNP transistor to apply ground to the output terminal.

9 Claims, 1 Drawing Sheet

COMPLEMENTARY BIPOLAR COMPLEMENTARY CMOS (CBICMOS) TRANSMISSION GATE

This application is related to applicant's co-pending U.S. patent application Ser. No. 07/500,277, filed Mar. 27, 1990 for "Compound Modulated Integrated Transistor Structure", a continuation of U.S. patent application Ser. No. 07/053,303 filed May 22, 1987, now abandoned.

BACKGROUND OF THE INVENTION

This invention relates generally to high speed logic elements, and more particularly the invention relates to high speed complementary bipolar complementary MOS (CBiCMOS) integrated circuits including complementary Schottky bipolar CMOS integrated circuits.

My issued U.S. Pat. No. 4,920,399 and my copending application Ser. No. 07/528,950 filed May 25, 1990 disclose the use of CBiCMOS technology in constructing high speed logic elements. Simple CMOS logic inverters are described in which speed of operation is increased by merging complementary bipolar transistors in the CMOS devices. More particularly, in one embodiment Schottky contacts are made to the drains of the CMOS transistors and the Schottky p-n junctions become emitter-base junctions of the bipolar transistors. The Schottky contacts are interconnected to form the output of the invertor. Majority and minority carriers injected by the diodes modulate the channel regions of the MOS transistors, thereby lowering their resistivity and increasing the transconductance of the device without increasing the physical size or the capacitance of the device and thereby improving the speed of the device. Ohmic contacts can be made to the drain regions, and by interconnection of the ohmic contacts the low on resistance of the opposite polarity drive transistor extracts any excess stored charge in the drain region.

CMOS transmission gates are commonly used in CMOS technology to form multiplexer and flip-flop memory elements. However, the devices do not have sufficient current drive capability to be used effectively with high speed CBiCMOS technology. The present invention is directed to a high speed transmission gate using a CBiCMOS structure.

SUMMARY OF THE INVENTION

An object of the invention is an improved high speed transmission gate.

A feature of the invention is the use of a CMOS transistor pair to drive a complementary bipolar transistor pair.

Briefly, the high speed transmission gate in accordance with the invention includes a CMOS transistor pair in which two elements (source or drain) of the two MOS transistors are connected to an input terminal and two elements (drain or source) of the MOS transistors are connected respectively to the base elements of complementary bipolar transistors. The two bipolar transistors are serially connected with common emitters between two voltage potentials. Assuming a logic one is plus 5 volts and a logic zero is 0 volt, the two voltage potentials are plus 5 volts and ground. Signals are applied to the gates of the two CMOS transistors but in opposite polarities to turn the transistors on. A logic one (+5 volts) is applied through a PMOS transistor to the base of an NPN transistor whereby a positive voltage on the collector of the transistor is applied to the circuit output, or the common emitters of the bipolar transistors. Conversely, a logic zero on the input is transmitted through the NMOS transistor to the base of a PNP transistor whereby a ground voltage on the collector of the PNP transistor is applied to the circuit output connection at the common emitters.

The invention and objects and features thereof will be more readily apparent from the following detailed description and appended claims when taken with the drawing.

DETAILED DESCRIPTION OF ILLUSTRATIVE EMBODIMENTS

Figure 1:
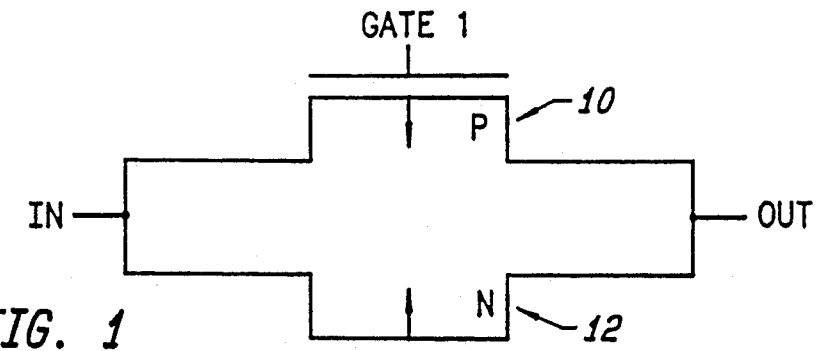
FIG. 1 is a schematic diagram of a conventional CMOS transmission gate.

Referring now to the drawing, FIG. 1 is a schematic of a conventional CMOS transmission gate. Two terminals (source or drain) of the transistors 10, 12 are connected as the input, and two terminals of the transistors (drain or source) are connected as the output. The transistors are normally non-conducting until opposite polarity voltages are applied to the gates of the p-channel and n-channel transistors. A negative voltage applied to the gate of the p-channel transistor renders the transistor conductive, and a positive voltage applied to the gate of the n-channel transistor renders the n-channel transistor conductive. Under such bias conditions the input signal, either a logic one (+5 volts) or a logic zero (ground) is transmitted through the transistors to the output. When the bias voltages to the CMOS transistors are reversed, the signal path from input to output is open circuited and no current flows.

Drive current using the conventional transmission gate of FIG. 1 is limited by the on resistance of the MOS transistors. In accordance with the present invention a CBiCMOS transmission gate is provided in which circuit operation and performance is substantially enhanced in allowing higher speed operation and increased drive current.

Figure 2:
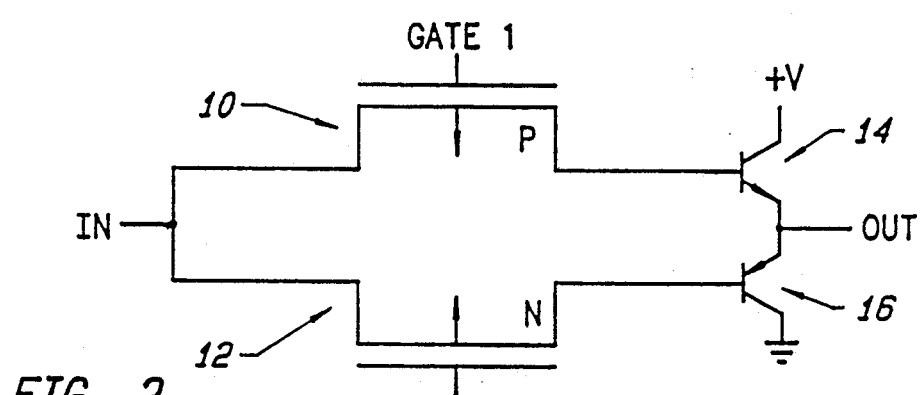
FIG. 2 is a schematic diagram of a transmission gate in accordance with one embodiment of the invention.

FIG. 2 is a schematic of a transmission gate in accordance with one embodiment of the invention in which two terminals of the p-channel transistor 10 and the n-channel 12 are connected to an input. However, the other two terminals of the two transistors are connected to the bases of two serially connected complementary bipolar transistors 14 and 16 which are serially connected with common emitters between two voltage terminals such as +5 volts and ground. Again, assume that a logic one is +5 volts and a logic zero is 0 volt. When a logic one (+5 volt) is applied to the input and the transmission gates 10 and 12 are biased on, the +5 volt is applied through PMOS transistor 10 to the base of NPN transistor 14 the transistor becomes conducting thereby applying the voltage (+v) at its collector to the output. Conversely, when a logic zero (ground) is applied to the input, the ground potential is applied through NMOS transistor 12 to the base of PNP transistor 16 thereby rendering the transistor conductive and applying the ground at its collector to the output. Since the base current in the complementing bipolar transistor is cut off during either of the input conditions, complementary current flow is maintained. Since current flows to the output through a low resistance of the bipolar transistors to the power supply, the circuit has power gain and can charge or discharge a capacitance and resistance load very rapidly compared to an MOS transmission gate, thereby allowing very high speed circuit operation to take place. Further, since the output terminal is open circuited in the off condition of the transmission gate, no current can flow to the output and the normal logic transmission gate function is maintained.

Figure 3:
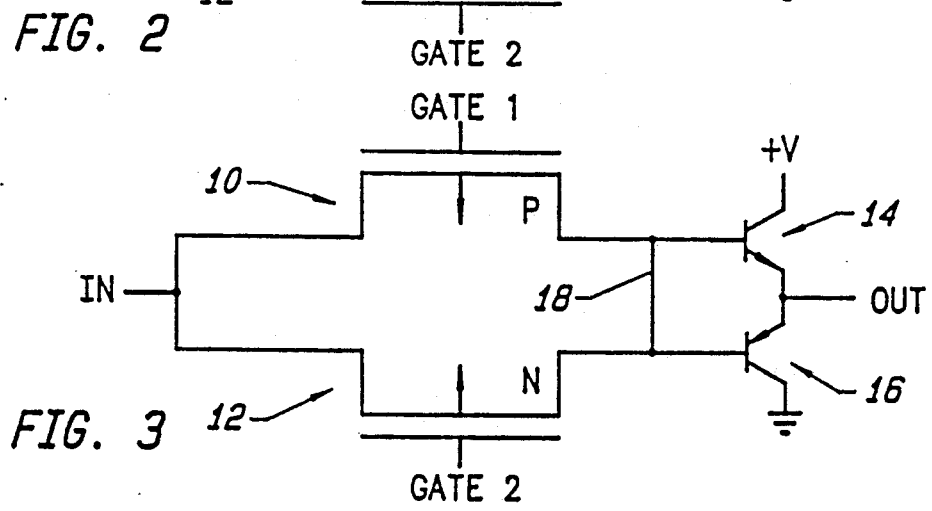
FIG. 3 is a schematic diagram of a transmission gate in accordance with another embodiment of the invention.

The complementary bipolar transistors 14 and 16 in FIG. 2 can include complementary Schottky transistors as taught in my U.S. Pat. No. 4,920,399. Further, speed of operation can be enhanced by interconnecting the base regions of the two bipolar transistors as illustrated at 18 in FIG. 3. All other elements of the circuit of FIG. 3 are the same as the circuit shown in FIG. 2 and like elements of the same reference numerals. The bipolar transistors can have either Schottky emitter-base junctions or P-N junctions formed by doped regions forming rectifying contacts with the base regions. This mode of operation is taught in my copending application Ser. No. 07/528,950, supra.

Figure 4:
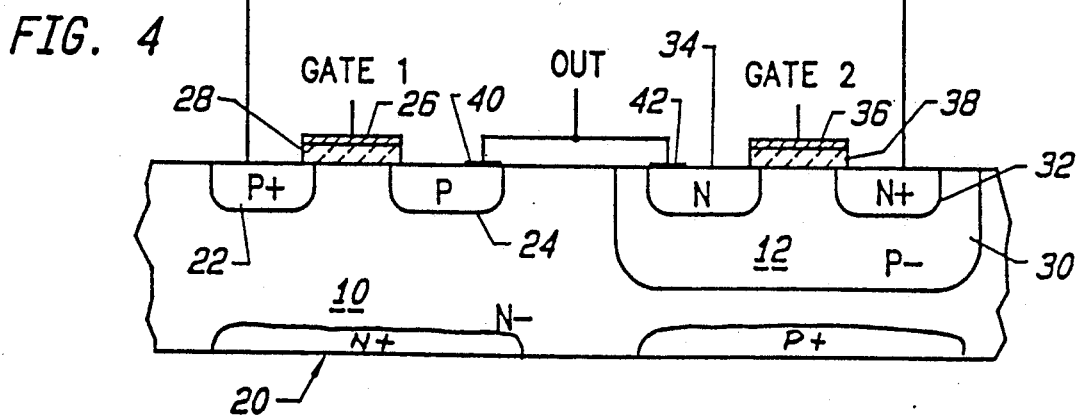
FIG. 4 is a section view of the circuit of FIG. 2 in an integrated circuit.

FIG. 4 is a section view of the transmission gate of FIG. 2 using Schottky transistors are taught in U.S. Pat. No. 4,920,399, supra. The device is fabricated in a lightly doped n— silicon substrate 20 with the p-channel transistor 10 comprising a p+ source region 22, a p-type drain region 24 with a gate 26 overlying silicon oxide insulation 28 between the source 22 and drain 24. The NMOS transistor 12 is formed in a p— well 30 formed in a surface of the substrate 20. The transistor includes an n+ source region 32 and an n doped drain region 34 with the gate 36 overlying silicon oxide 38 between the source and drain. Schottky contacts 40 and 42 are formed to the p-doped drain region 24 and the n-doped drain region 34, and the Schottky contacts are interconnected to form the output of the transmission gate. The source regions 22 and 32 are interconnected as the input. The embodiment of FIG. 3 can be readily fabricated as taught in my copending application by forming ohmic contacts to the drains of the two CMOS transistors (bases of the two bipolar transistors) and interconnecting the ohmic contacts. The Schottky emitters can be replaced by doped emitter regions in the base regions.

There has been described an improved transmission gate utilizing complementary bipolar complementary MOS (CBiCMOS) transistor structures. While the invention has been described with reference to a specific embodiments, the description is illustrative of the invention and is not to be construed as limiting the invention. Various modifications and applications may occur to those skilled in the art without departing from the true spirit and scope of the invention as defined by the appended claims.

I claim:

1. A complementary bipolar complementary CMOS (CBiCMOS) transmission gate comprising
   a CMOS transistor pair including a PMOS transistor having a source, a drain, and gate and an NMOS transistor having a source, a drain, and a gate,
   a input terminal connected to said source of said PMOS transistor and to said source of said NMOS transistor,
   a complementary transistor pair including an NPN transistor having an emitter, a base, and a collector and a PNP transistor having an emitter, a base, and a collector,
   means connecting said collector of said NPN transistor to a first voltage potential,
   means connecting said collector of said PNP transistor to a second voltage potential, said second voltage potential being less positive than said first voltage potential,
   an output terminal connected to said emitter of said NPN transistor and to said emitter of said PNP transistor,
   means connecting said drain of said PMOS transistor to said base of said NPN transistor, and
   means connecting said drain of said NMOS transistor to said base of said PNP transistor,
   whereby when said gates of said CMOS transistor pair are biased for conduction of said CMOS transistor pair a logic one on said input is applied to said base of said NPN transistor thereby connecting said first voltage potential to said output terminal, and a logic zero on said input is applied to said base of said PNP transistor thereby connecting said second voltage potential to said output terminal.

2. The transmission gate as defined by claim 1 and further including means interconnecting said drains of said CMOS transistor pair thereby extracting excess stored charge in said drain regions through the low on resistance of said bipolar transistors.

3. The transmission gate as defined by claim 2 wherein said transmission gate comprises an integrated circuit.

4. The transmission gate as defined by claim 3 and further including rectifying contacts to said drains, said rectifying contacts and said drains comprising emitters and bases of said bipolar transistors.

5. The transmission gate as defined by claim 4 wherein said rectifying contacts are Schottky contacts.

6. The transmission gate as defined by claim 1 wherein said transmission gate comprises an integrated circuit.

7. The transmission gate as defined by claim 6 and further including Schottky contacts to said drains, said Schottky contacts and said drains comprising emitters and bases of said bipolar transistors.

8. The transmission gate as defined by claim 6 and further including rectifying contacts to said drains, said rectifying contacts and said drains comprising emitters and bases of said bipolar transistors.

9. The transmission gate as defined by claim 1 wherein said second voltage potential is ground.

* * * * *